(12) United States Patent
Yamashita

(10) Patent No.: US 12,677,709 B2
(45) Date of Patent: Jul. 7, 2026

(54) SEMICONDUCTOR DEVICE

(71) Applicant: Mitsubishi Electric Corporation,
Tokyo (JP)

(72) Inventor: Tetsuo Yamashita, Tokyo (JP)

(73) Assignee: Mitsubishi Electric Corporation,
Tokyo (JP)

( * ) Notice: Subject to any disclaimer, the term of this
patent is extended or adjusted under 35
U.S.C. 154(b) by 327 days.

(21) Appl. No.: 18/405,005

(22) Filed: Jan. 5, 2024

(65) Prior Publication Data

US 2024/0395777 A1 Nov. 28, 2024

(30) Foreign Application Priority Data

May 25, 2023 (JP) ................................. 2023-085872

(51) Int. Cl.
*H10W 90/00* (2026.01)
*H10W 70/60* (2026.01)
*H10W 70/65* (2026.01)

(52) U.S. Cl.
CPC .......... *H10W 90/00* (2026.01); *H10W 70/611*
(2026.01); *H10W 70/65* (2026.01); *H10W*
*90/754* (2026.01)

(58) Field of Classification Search
CPC ............................ H10W 90/00; H10W 70/611
See application file for complete search history.

(56) References Cited

U.S. PATENT DOCUMENTS

2014/0145240 A1 5/2014 Harrington
2022/0311431 A1* 9/2022 Nakashima ............. H02M 1/08
2023/0014848 A1* 1/2023 Maruyama ............ H10W 90/00

FOREIGN PATENT DOCUMENTS

| JP | 2003-188336 A | 7/2003 | |
|---|---|---|---|
| JP | 2010-027691 A | 2/2010 | |
| JP | 2016-508284 A | 3/2016 | |
| JP | 2017-069616 A | 4/2017 | |
| JP | 2018-078406 A | 5/2018 | |
| JP | 2021-044996 A | 3/2021 | |
| WO | WO-2021038724 A1 * | 3/2021 | ............ H10W 90/00 |

OTHER PUBLICATIONS

"Notice of Reasons for Refusal" Office Action issued in JP 2023-085872; mailed by the Japanese Patent Office on May 19, 2026.

* cited by examiner

*Primary Examiner* — Vincent Wall
(74) *Attorney, Agent, or Firm* — Studebaker Brackett PLLC

(57) ABSTRACT

An object of the present disclosure is to suppress reduction of noise resistance and parasitic oscillation in a semiconductor device. A semiconductor device includes: a plurality of semiconductor chips parallelly connected to each other; a source electrode; a first source pattern connected to the source electrode; a source sensing terminal; and a second source pattern connected to the source sensing terminal, wherein a surface of each of the semiconductor chips is connected to the first source pattern, a surface of a reference chip is connected to the second source pattern, a surface of at least one non-reference chip as the semiconductor chip other than the reference chip is not connected to the second source pattern, and a resistance value of a gate resistance of the reference chip is larger than a resistance value of a gate resistance of the non-reference chip.

7 Claims, 6 Drawing Sheets

101, 102

F I G.  1
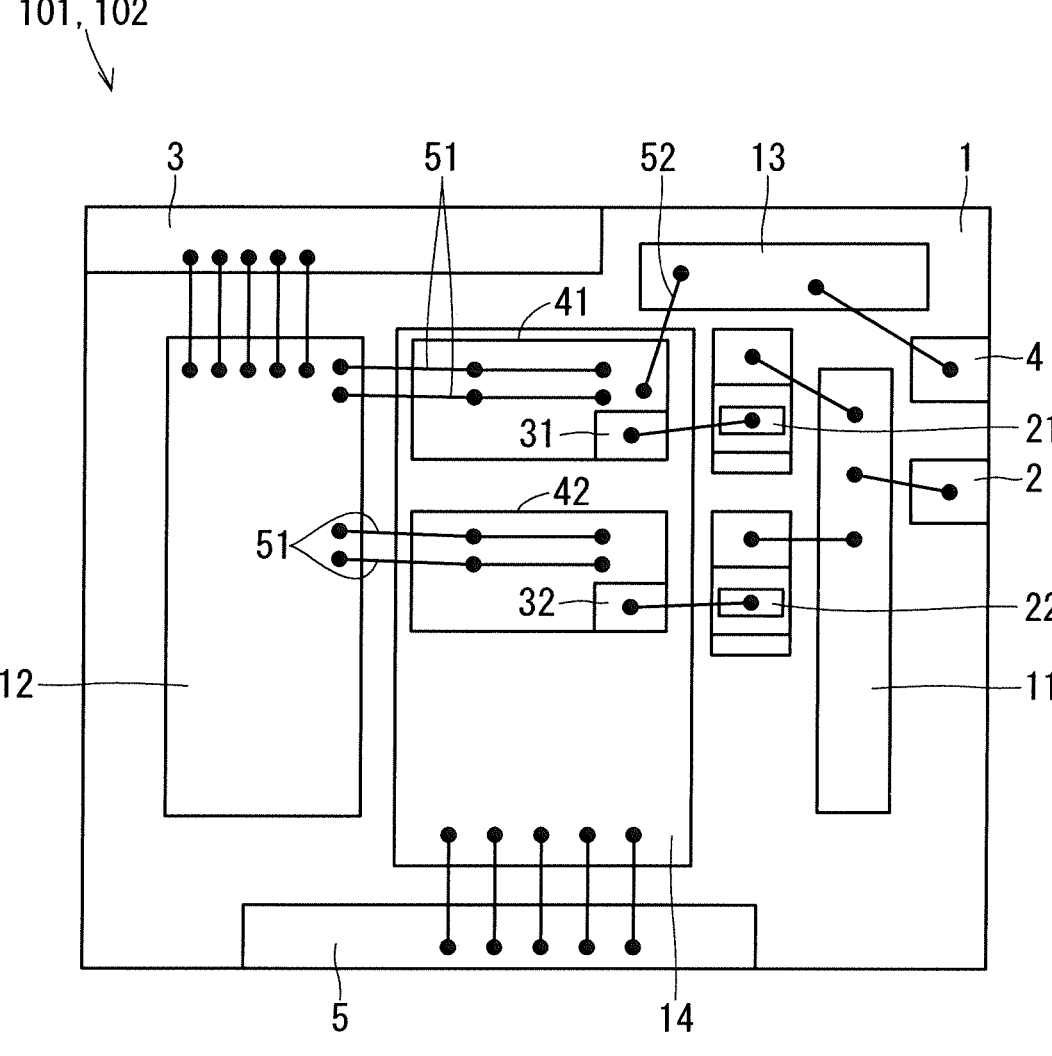

F I G .  2
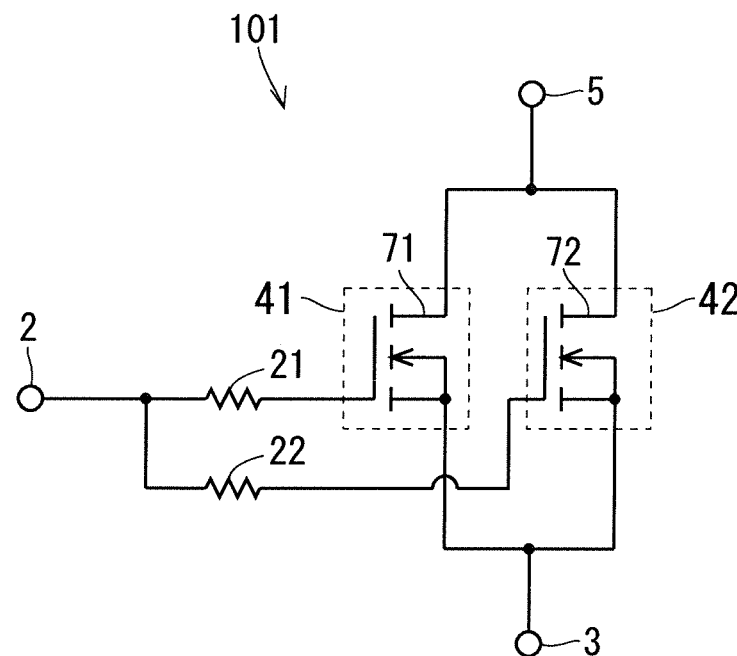

F I G. 3
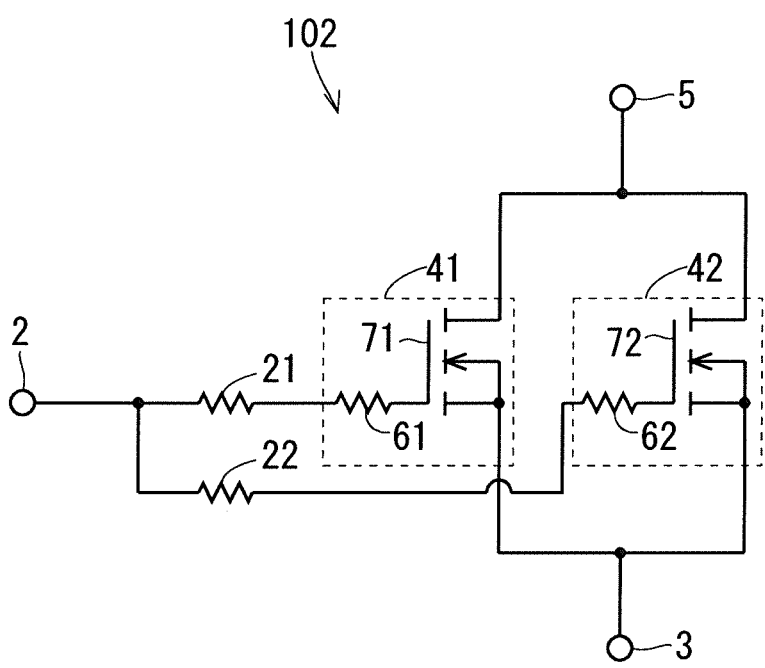

F I G .  4
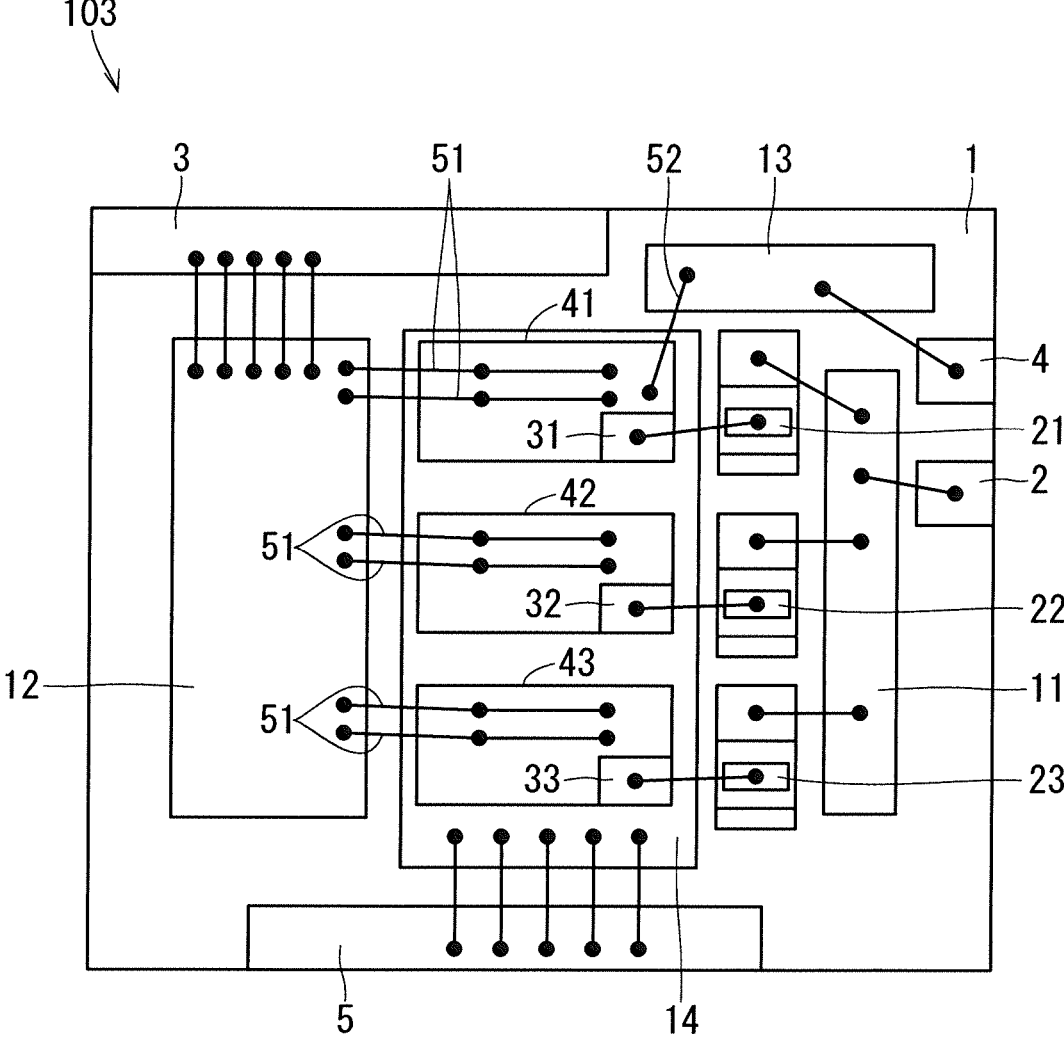

F I G.  5
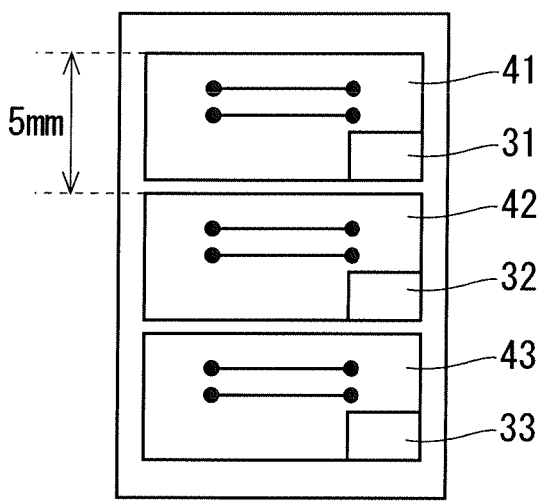

F I G.  6
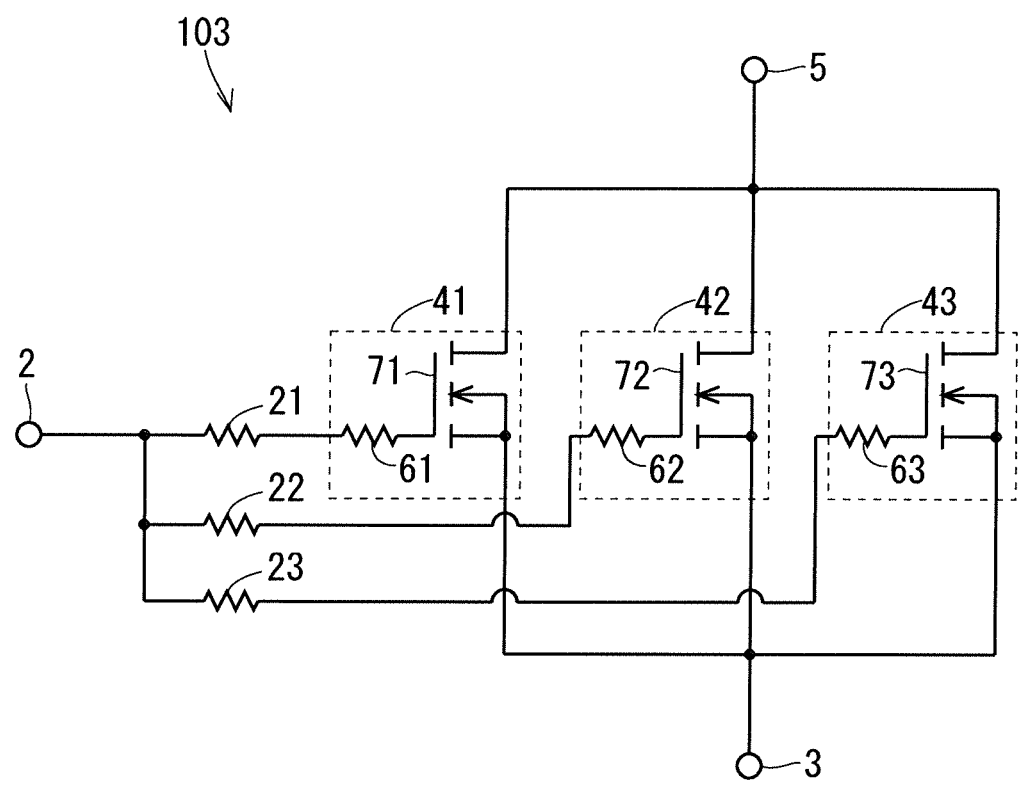

SEMICONDUCTOR DEVICE

BACKGROUND OF THE INVENTION

Field of the Invention

The present disclosure relates to a semiconductor device.

Description of the Background Art

Described in Japanese Patent Application Laid-Open No. 2021-44996 is a power conversion device in which a plurality of power semiconductor modules are parallelly connected to each other. According to this power conversion device, switching loss can be reduced while suppressing parasitic oscillation occurring in a switching operation.

A power conversion device of Japanese Patent Application Laid-Open No. 2021-44996 includes a plurality of semiconductor modules (semiconductor chips) parallelly connected to each other, and a source electrode of each semiconductor chip is connected to a source sensing drive terminal. Such a structure has a problem that magnetic flux occurs due to loop current of a source, and noise resistance decreases. There is also a problem that deterioration of a current balance is triggered by the loop current, and parasitic oscillation occurs.

SUMMARY

An object of the present disclosure is to suppress reduction of noise resistance and parasitic oscillation in a semiconductor device.

A semiconductor device according to the present disclosure includes a plurality of semiconductor chips, a source electrode, a first source pattern, a source sensing terminal, and a second source pattern. The plurality of semiconductor chips are parallelly connected to each other. The first source pattern is connected to the source electrode. The second source pattern is connected to the source sensing terminal. A surface of each semiconductor chip is connected to the first source pattern. A surface of a reference chip as one of the plurality of semiconductor chips is connected to the second source pattern. A surface of at least one non-reference chip as a semiconductor chip other than the reference chip is not connected to the second source pattern. A resistance value of a gate resistance of the reference chip is larger than a resistance value of a gate resistance of the non-reference chip.

According to the semiconductor device of the present disclosure, the surface of the non-reference chip is not connected to the source sensing terminal via the second source pattern, thus reduction of noise resistance due to loop current of a source is suppressed. The resistance value of the gate resistance of the reference chip is larger than the resistance value of the gate resistance of the non-reference chip, thus di/dt in a turning-on operation is uniformized between the semiconductor chips, and parasitic oscillation can be suppressed while reduction of gain of a positive feedback loop is achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a configuration diagram of a semiconductor device according to an embodiment 1.

FIG. 2 is a circuit diagram of the semiconductor device according to the embodiment 1.

FIG. 3 is a circuit diagram of a semiconductor device according to an embodiment 2.

FIG. 4 is a configuration diagram of a semiconductor device according to an embodiment 3.

FIG. 5 is a diagram illustrating an arrangement pitch of semiconductor chips in the semiconductor device according to the embodiment 3.

FIG. 6 is a circuit diagram of the semiconductor device according to the embodiment 3.

DESCRIPTION OF THE PREFERRED EMBODIMENTS

A. Embodiment 1

<A-1. Configuration>

FIG. 1 is a configuration diagram of a semiconductor device 101 according to an embodiment 1. The semiconductor device 101 includes an insulating substrate 1, a gate terminal 2 formed on the insulating substrate 1, a source electrode 3, a source sensing terminal 4, a drain electrode 5, a gate pattern 11, a first source pattern 12, a second source pattern 13, a drain pattern 14, a first gate resistance 21, and a second gate resistance 22.

The source electrode 3 and the first source pattern 12 are electrically connected to each other by an aluminum wire, for example. The drain electrode 5 and the drain pattern 14 are electrically connected to each other by an aluminum wire, for example. The source sensing terminal 4 and the second source pattern 13 are electrically connected to each other by an aluminum wire, for example. The gate terminal 2 and the gate pattern 11 are electrically connected to each other by an aluminum wire, for example.

Two semiconductor chips, that is to say, a first semiconductor chip 41 and a second semiconductor chip 42 are mounted on the drain pattern 14. A surface of the first semiconductor chip 41 is connected to the first source pattern 12 by a first source wire 51, and is connected to the second source pattern 13 by a second source wire 52. A gate pad 31 of the first semiconductor chip 41 is electrically connected to the first gate resistance 21 by an aluminum wire, for example. That is to say, the first gate resistance 21 is an external resistance of the first semiconductor chip 41.

A surface of the second semiconductor chip 42 is connected to the first source pattern 12 by the first source wire 51. The surface of the second semiconductor chip 42 is different from the first semiconductor chip 41, thus is not connected to the second source pattern 13. The gate pad 32 of the second semiconductor chip 42 is electrically connected to the second gate resistance 22 by an aluminum wire, for example. That is to say, the second gate resistance 22 is an external resistance of the second semiconductor chip 42.

FIG. 2 is a circuit diagram of the semiconductor device 101. As illustrated in FIG. 2, the first semiconductor chip 41 constitutes a MOSFET 71, and the second semiconductor chip 42 constitutes a MOSFET 72. A drain of each of the MOSFETs 71 and 72 is connected to the drain electrode 5, and a source of each of the MOSFETs 71 and 72 is connected to the source electrode 3. In this manner, the first semiconductor chip 41 and the second semiconductor chip 42 are connected parallelly connected to each other between the drain electrode 5 and the source electrode 3. A gate of the first semiconductor chip 41 is connected to the gate terminal 2 via the first gate resistance 21. A gate of the second semiconductor chip 42 is connected to the gate terminal 2 via the second gate resistance 22.

A surface of the first semiconductor chip 41 is connected to the source sensing terminal 4 by the second source pattern 13. Accordingly, potential of the surface of the first semiconductor chip 41 serves as reference potential of the source sensing terminal 4. In the present specification, a semiconductor chip supplying the reference potential of the source sensing terminal 4 is referred to as a reference chip, and a semiconductor chip which does not supply the reference potential of the source sensing terminal 4 is referred to as a non-reference chip. Positive feedback (high di/dt) is applied to the first semiconductor chip 41 as the reference chip in driving. In the meanwhile, negative feedback (low di/dt) is applied to the second semiconductor chip 42 as the non-reference chip in driving. Thus, imbalance occurs in rise of turning-on current (di/dt) between the semiconductor chips.

Thus, in the semiconductor device 101, a resistance value of the first gate resistance 21 connected to the first semiconductor chip 41 as the reference chip is made to be larger than that of the second gate resistance 22 connected to the second semiconductor chip 42 which is not the reference chip. More specifically, the resistance value of the first gate resistance 21 is three times or more as large as that of the second gate resistance 22. Accordingly, di/dt in a turning-on operation is uniformized between the semiconductor chips, and loss deterioration can be suppressed to a minimum while reduction of gain of a positive feedback loop is achieved.

It is difficult to obtain the reference potential of the source sensing terminal 4 from the surface of all of the semiconductor chips for a manufactural reason. When the reference potential of the source sensing terminal 4 is obtained from the surface of all of the semiconductor chips, magnetic flux occurs due to loop current of a source, and such a configuration causes reduction of noise resistance. Thus, only the first semiconductor chip 41 serves as the reference chip in the semiconductor device 101.

The first gate resistance 21 and the second gate resistance 22 preferably have negative temperature characteristics. When the gate resistance has positive temperature characteristics, the resistance value increases at a high temperature and loss is unnecessarily deteriorated. The resistance having the negative temperature characteristics is used for the first gate resistance 21 the second gate resistance 22, thus balance of rise of turning-on current between the semiconductor chips is improved and loss in an actual operation is reduced.

In FIG. 2, the first semiconductor chip 41 and the second semiconductor chip 42 are the chips of MOSFET, however, they may be chips of the other switching element or diode element.

The first semiconductor chip 41 and the second semiconductor chip 42 may be made up of a wide bandgap semiconductor. The wide bandgap semiconductor has high voltage resistance properties and a high allowable current density, thus the switching element or the diode element can be downsized, and these downsized switching element or diode element can become more efficient.

<A-2. Effect>

The semiconductor device 101 according to the embodiment 1 includes the plurality of semiconductor chips 41 and 42 parallelly connected to each other, the source electrode 3, the first source pattern 12 connected to the source electrode 3, the source sensing terminal 4, and the second source pattern 13 connected to the source sensing terminal 4. The surface of each of the semiconductor chips 41 and 42 is connected to the first source pattern 12. The surface of the reference chip 41 as one of the plurality of semiconductor chips 41 and 42 is connected to the second source pattern 13. The surface of at least one non-reference chip 42 as the semiconductor chip other than the reference chip 41 is not connected to the second source pattern 13. Only the semiconductor chip 41 serves as the reference chip, thus suppressed is reduction of noise resistance due to loop current of the source.

The resistance value of the gate resistance of the first semiconductor chip 41 as the reference chip is larger than that of the gate resistance of the second semiconductor chip 42 as the non-reference chip, thus di/dt in the turning-on operation is uniformized between the semiconductor chips, and loss deterioration can be suppressed to a minimum while reduction of gain of the positive feedback loop is achieved.

B. Embodiment 2

<B-1. Configuration>

A configuration of a semiconductor device 102 according to an embodiment 2 is as illustrated in FIG. 1, and is similar to that of the semiconductor device 101 according to the embodiment 1.

FIG. 3 is a circuit diagram of the semiconductor device 102. The semiconductor device 102 is different from the semiconductor device 101 in that each of the first semiconductor chip 41 and the second semiconductor chip 42 includes a gate resistance in the chip. The gate resistance in these chips is referred to as a first inner gate resistance 61 in the first semiconductor chip 41 and a second inner gate resistance 62 in the second semiconductor chip 42. That is to say, the first semiconductor chip 41 includes a MOSFET 71 and the first inner gate resistance 61, and the second semiconductor chip 42 includes a MOSFET 72 and the second inner gate resistance 62.

According to such a configuration, the gate resistance of the MOSFET 71 is a combination resistance of the first inner gate resistance 61 and the first gate resistance 21, and the gate resistance of the MOSFET 72 is a combination resistance of the second inner gate resistance 62 and the second gate resistance 22. When the resistance value of the gate resistance is the same as each other, the effect of suppressing oscillation is further obtained when the gate resistance is located in or closer to the semiconductor chip. Accordingly, when the first semiconductor chip 41 and the second semiconductor chip 42 have the configuration including the gate resistance therein, the effect of suppressing oscillation is obtained compared with the configuration of the embodiment 1.

The first inner gate resistance 61 and the second inner gate resistance 62 preferably have negative temperature characteristics in the manner similar to the external resistance. The resistance having the negative temperature characteristics is used for the first inner gate resistance 61 the second inner gate resistance 62, thus balance of rise of turning-on current between the semiconductor chips is improved and loss in an actual operation is reduced.

The semiconductor device 102 includes two semiconductor chip parallelly connected to each other in the manner similar to the semiconductor device 101 according to the embodiment 1. The first gate resistance 21 connected to the first semiconductor chip 41 as the reference chip preferably has a resistance value equal to or larger than the first inner gate resistance 61. The second gate resistance 22 connected to the second semiconductor chip 42 as the non-reference chip preferably has a resistance value equal to or larger than the second inner gate resistance 62. In this manner, the appropriate external resistance is connected in series to each semiconductor chip, thus obtained is the effect that loss deterioration is suppressed to a minimum while di/dt in the turning-on operation is uniformized between the first semiconductor chip 41 and the second semiconductor chip 42.
<B-2. Effect>

In the semiconductor device 102 according to the embodiment 2, the gate resistance of the first semiconductor chip 41 is the combination resistance of the first gate resistance 21 as the external resistance of the first semiconductor chip 41 and the first inner gate resistance 61 located in the first semiconductor chip 41. The gate resistance of the second semiconductor chip 42 is the combination resistance of the second gate resistance 22 as the external resistance of the second semiconductor chip 42 and the second inner gate resistance 62 located in the second semiconductor chip 42. According to such a configuration, the effect of suppressing oscillation is obtained more than the configuration of the embodiment 1.

C. Embodiment 3

<C-1. Configuration>

A semiconductor device 103 according to an embodiment 3 includes three or more and six or less semiconductor chips parallelly connected to each other while the semiconductor device 102 according to the embodiment 2 includes two semiconductor chips parallelly connected to each other. In the description hereinafter, the semiconductor device 103 includes three semiconductor chips.

FIG. 4 is a configuration diagram of the semiconductor device 103 according to the embodiment 3. The semiconductor device 103 includes a third semiconductor chip 43 and a third gate resistance 23 in addition to the configuration of the semiconductor device 102 according to the embodiment 2. The third gate resistance 23 is an external resistance of the third semiconductor chip 43.

The third semiconductor chip 43 is mounted on the drain pattern 14. A surface of the third semiconductor chip 43 is electrically connected to the first source pattern 12 by the first source wire 51. The surface of the third semiconductor chip 43 is not connected to the second source pattern 13 in the manner similar to the second semiconductor chip 42. That is to say, the third semiconductor chip 43 is a non-reference chip. A gate pad 33 of the third semiconductor chip 43 is electrically connected to the third gate resistance 23 by an aluminum wire, for example.

FIG. 5 illustrates an arrangement pitch of the semiconductor chips in the semiconductor device 103. As illustrated in FIG. 5, the arrangement pitch of the semiconductor chips in the semiconductor device 103 is equal to or larger than 5 mm. This 5 mm is a distance which must be ensured for a manufactural reason.

FIG. 6 is a circuit diagram of the semiconductor device 103. The first semiconductor chip 41, the second semiconductor chip 42, and the third semiconductor chip 43 are parallelly connected to each other between the drain electrode 5 and the source electrode 3. The third semiconductor chip 43 includes a MOSFET 73 and a third inner gate resistance 63. The third inner gate resistance 63 is connected to the third gate resistance 23.

In the semiconductor device 103, a relationship a resistance value between an external resistance and an inner resistance in the reference chip and the non-reference chip is similar to that in the semiconductor device 102 according to the embodiment 2. The third gate resistance 23 which is an external resistance of the third semiconductor chip 43 as the non-reference chip has a resistance value equal to or smaller than a half the third inner gate resistance 63. According to the above configuration, loss deterioration can be suppressed to a minimum while di/dt of each semiconductor chip in a turning-on operation is uniformized in a region which can be handled in a current process.

All of the semiconductor chips in the semiconductor device 103 may be made up of a wide bandgap semiconductor. The wide bandgap semiconductor has high voltage resistance properties and a high allowable current density, thus the switching element or the diode element can be downsized, and these downsized switching element or diode element can become more efficient.
<C-2. Effect>

In the semiconductor device 103 according to the embodiment 3, at least one non-reference chip is two or more and five or less non-reference chips, and the arrangement pitch of the semiconductor chips is equal to or larger than 5 mm or more. According to the above configuration, loss deterioration can be suppressed to a minimum while di/dt of each semiconductor chip in a turning-on operation is uniformized in a region which can be handled in a current process.

While the embodiments etc. have been shown and described in detail, the above embodiments are not restrictive. Various modifications and replacements can be added to the above embodiments without departing from the scope of claims.

The aspects of the present disclosure are collectively described hereinafter as appendixes.

Appendix 1

A semiconductor device, comprising:

a plurality of semiconductor chips parallelly connected to each other;

a source electrode;

a first source pattern connected to the source electrode;

a source sensing terminal; and a second source pattern connected to the source sensing terminal, wherein a surface of each of the semiconductor chips is connected to the first source pattern, a surface of a reference chip as one of the plurality of semiconductor chips is connected to the second source pattern, a surface of at least one non-reference chip as one of the semiconductor chips other than the reference chip is not connected to the second source pattern, and a resistance value of a gate resistance of the reference chip is larger than a resistance value of a gate resistance of the non-reference chip.

Appendix 2

The semiconductor device according to Appendix 1, wherein the gate resistance of each of the semiconductor chips is a combination resistance of an external gate resistance externally provided to each of the semiconductor chips and an inner gate resistance located in a chip of each of the semiconductor chips.

Appendix 3

The semiconductor device according to Appendix 2, wherein a resistance value of the external gate resistance of the reference chip is larger than a resistance value of the inner gate resistance of the reference chip, and a resistance value of the external gate resistance of the non-reference chip is equal to or smaller than a half a resistance value of the inner gate resistance of the non-reference chip.

Appendix 4

The semiconductor device according to any one of Appendixes 1 to 3, wherein
a resistance value of the external gate resistance of the reference chip is three times or more as large as a resistance value of the external gate resistance of the non-reference chip.

Appendix 5

The semiconductor device according to any one of Appendixes 1 to 4, wherein
the gate resistance of each of the semiconductor chips has negative temperature characteristics.

Appendix 6

The semiconductor device according to Appendix 3, wherein
at least one non-reference chip is two or more and five or less non-reference chips, and
an arrangement pitch of the semiconductor chips is equal to or larger than 5 mm.

Appendix 7

The semiconductor device according to any one of Appendixes 1 to 6, wherein
each of the semiconductor chips is made up of a wide bandgap semiconductor.
What is claimed is:
1. A semiconductor device, comprising:
a plurality of semiconductor chips parallelly connected to each other;
a source electrode;
a first source pattern connected to the source electrode;
a source sensing terminal; and
a second source pattern connected to the source sensing terminal, wherein
a surface of each of the semiconductor chips is connected to the first source pattern, a surface of a reference chip as one of the plurality of semiconductor chips is connected to the second source pattern,
a surface of at least one non-reference chip as one of the semiconductor chips other than the reference chip is not connected to the second source pattern, and
a resistance value of a gate resistance of the reference chip is larger than a resistance value of a gate resistance of the non-reference chip.
2. The semiconductor device according to claim 1, wherein
the gate resistance of each of the semiconductor chips is a combination resistance of an external gate resistance externally provided to each of the semiconductor chips and an inner gate resistance located in a chip of each of the semiconductor chips.
3. The semiconductor device according to claim 2, wherein
a resistance value of the external gate resistance of the reference chip is larger than a resistance value of the inner gate resistance of the reference chip, and
a resistance value of the external gate resistance of the non-reference chip is equal to or smaller than a half a resistance value of the inner gate resistance of the non-reference chip.
4. The semiconductor device according to claim 1, wherein
a resistance value of the external gate resistance of the reference chip is three times or more as large as a resistance value of the external gate resistance of the non-reference chip.
5. The semiconductor device according to claim 1, wherein
the gate resistance of each of the semiconductor chips has negative temperature characteristics.
6. The semiconductor device according to claim 3, wherein
at least one non-reference chip is two or more and five or less non-reference chips, and
an arrangement pitch of the semiconductor chips is equal to or larger than 5 mm.
7. The semiconductor device according to claim 1, wherein
each of the semiconductor chips is made up of a wide bandgap semiconductor.

* * * * *